United States Patent
Dutt et al.

(10) Patent No.: US 9,230,888 B2
(45) Date of Patent: Jan. 5, 2016

(54) WAFER BACK SIDE COATING AS DICING TAPE ADHESIVE

(71) Applicant: Henkel IP & Holding GmbH, Duesseldorf (DE)

(72) Inventors: Gyanendra Dutt, Garden Grove, CA (US); Qizhuo Zhuo, Irvine, CA (US); Elizabeth Hoang, Orange, CA (US); Stephen Ruatta, South Pasadena, CA (US)

(73) Assignee: Henkel IP & Holding GmbH, Duesseldorf (DE)

( * ) Notice: Subject to any disclaimer, the term of this patent is extended or adjusted under 35 U.S.C. 154(b) by 56 days.

(21) Appl. No.: 13/833,634

(22) Filed: Mar. 15, 2013

(65) Prior Publication Data

US 2014/0225283 A1    Aug. 14, 2014

Related U.S. Application Data

(60) Provisional application No. 61/763,192, filed on Feb. 11, 2013.

(51) Int. Cl.
| | | |
|---|---|---|
| H01L 21/00 | (2006.01) | |
| H01L 23/488 | (2006.01) | |
| H01L 21/683 | (2006.01) | |
| H01L 23/00 | (2006.01) | |

(52) U.S. Cl.
CPC .......... *H01L 23/488* (2013.01); *H01L 21/6836* (2013.01); *H01L 24/27* (2013.01); *H01L 24/29* (2013.01); *H01L 2221/6834* (2013.01); *H01L 2221/68327* (2013.01); *H01L 2221/68377* (2013.01); *H01L 2221/68381* (2013.01); *H01L 2224/27416* (2013.01); *H01L 2224/27418* (2013.01); *H01L 2224/27848* (2013.01); *H01L 2224/2919* (2013.01); *H01L 2224/83191* (2013.01); *H01L 2224/83856* (2013.01); *H01L 2224/94* (2013.01)

(58) Field of Classification Search
CPC ..... H01L 21/301; H01L 21/78; H01L 23/488; H01L 21/6836; H01L 2224/83191; H01L 24/29; H01L 2221/68327; H01L 2221/6834; H01L 2224/27416; H01L 2221/68377
USPC .......... 438/465, 968, 113, 114, 758; 257/678, 257/793, E21.21, 783

See application file for complete search history.

(56) References Cited

U.S. PATENT DOCUMENTS

| | | | |
|---|---|---|---|
| 6,938,783 B2 * | 9/2005 | Chung | 211/41.18 |
| 2003/0162368 A1 * | 8/2003 | Connell et al. | 438/465 |
| 2005/0064683 A1 * | 3/2005 | Farnworth et al. | 438/464 |
| 2008/0012098 A1 * | 1/2008 | Chow et al. | 257/666 |
| 2008/0241995 A1 | 10/2008 | Fukui et al. | |
| 2011/0151624 A1 * | 6/2011 | Xu et al. | 438/114 |
| 2011/0187009 A1 | 8/2011 | Masuko et al. | |
| 2013/0099396 A1 * | 4/2013 | Gasa et al. | 257/793 |

FOREIGN PATENT DOCUMENTS

| | | | |
|---|---|---|---|
| JP | 06000925 | * | 1/1994 |
| WO | 2012073972 A1 | | 6/2012 |

OTHER PUBLICATIONS

Zhang, Dong et al. "Mechanism of Corona Treatment on Polyolefin Films" Polymer Engineering and Science, Jun. 1998, vol. 38, No. 6, pp. 965-970.

* cited by examiner

*Primary Examiner* — Jarrett Stark
*Assistant Examiner* — Shahed Ahmed
(74) *Attorney, Agent, or Firm* — James J. Cummings

(57) ABSTRACT

A semiconductor assembly comprises a semiconductor wafer, an adhesive coating disposed on the back side of the wafer, and a bare dicing tape, preferably UV radiation transparent. The assembly is prepared by the method comprising (a) providing a semiconductor wafer, (b) disposing a wafer back side coating on the semiconductor wafer, (c) partially curing the wafer back side coating to the extent that it adheres to the back side of the wafer and remains tacky, and (d) contacting the bare dicing tape to the partially cured and tacky wafer back side coating, optionally with heat and pressure.

5 Claims, No Drawings

WAFER BACK SIDE COATING AS DICING TAPE ADHESIVE

BACKGROUND OF THE INVENTION

This invention relates to the use of die attach adhesive, applied to the back side of a semiconductor wafer, to adhere a dicing tape to the wafer. The dicing tape supports the semiconductor during the dicing operations that singulate the wafer into individual semiconductor dies.

In a conventional process for fabricating semiconductor dies, a semiconductor wafer is processed to form a plurality of circuits on the top side of the wafer, and in later steps, the wafer is separated into individual dies along prescribed dicing lines. The individual die is attached to its chosen substrate by an adhesive applied between the back side of the die and the substrate. The adhesive is known as a die attach adhesive.

Rather than apply the die attach adhesive to the individual dies, it is more efficient to apply the adhesive to the back side of the wafer before dicing. Coated onto the semiconductor wafer, the die attach adhesive is known as a wafer back side coating.

In order to support the semiconductor wafer coated with the back side coating during the dicing operation, a support tape, known as a dicing tape, is adhered to the back side coating of the wafer. After coating, the wafer back side adhesive is B-staged, that is, partially cured to a less tacky state. The dicing tape typically comprises at least two layers, one being the carrier tape and the other being an adhesive film for contacting and adhering to the back side coating.

During the dicing operation, the dicing blade moves at tens of thousands revolutions per minute, creating a locally high temperature along the dicing lines. This higher temperature causes the tacky wafer back side coating to soften and mix with the dicing tape adhesive, potentially reducing the reliability of the wafer back side coating as a die attach adhesive.

This invention is an improvement on the assembly of dicing tape and semiconductor wafer coated on its back side with a die attach adhesive.

SUMMARY OF THE INVENTION

This invention is a semiconductor assembly comprising a semiconductor wafer, an adhesive coating disposed on the back side of the wafer, and a bare dicing tape (also known as a carrier tape), in that order. In a preferred embodiment, the bare dicing tape is UV radiation transparent.

For purposes of this specification and the claims, the back side of the wafer is the side opposite that having the electric circuitry; the wafer back side coating is a die attach adhesive applied to the back side of the wafer; and the bare dicing tape is a dicing support tape that is used to support the wafer during dicing operations and that is not coated with any preapplied adhesive.

In another embodiment this invention is a method for preparing this assembly of semiconductor wafer, wafer back side coating, and bare dicing tape, the method comprising (a) providing a semiconductor wafer, (b) disposing a wafer back side coating on the semiconductor wafer, (c) partially curing the wafer back side coating to the extent that it adheres to the back side of the wafer and remains tacky, and (d) contacting the bare dicing tape to the partially cured and tacky wafer back side coating, optionally with heat and pressure.

DETAILED DESCRIPTION OF THE INVENTION

The semiconductor wafer is prepared, according to known methods from a semiconductor material, typically silicon, gallium arsenide, germanium, or similar compound semiconductor materials, to contain electronic circuitry is on one surface.

Wafer back side coatings are typically die attach adhesives, and can be any adhesive suitable for this purpose. Such adhesives are available commercially, such as, products WBC8901UV, and WBC8988UV, both epoxy/acrylic compositions available from Henkel Electronic Materials, LLC.

Dicing tapes suitable for supporting semiconductor wafers during dicing operations are composed of polyolefins and are commercially available, such as, for example, product UP8010W1 from Denka, and products UC3010110P and UC3004M80P from Furukawa. These tapes are UV transparent. Polyester tapes are also available, but these are usually not as stretchable as the polyolefin tapes, and are consequently less easy to use as dicing support tapes.

To prepare the assembly of semiconductor wafer, back side coating, and bare dicing tape, a wafer back side coating adhesive is deposited on the back side of the semiconductor wafer, the coating is partially cured, and the dicing tape is then laminated to the wafer back side coating. Deposition of the wafer back side coating onto the wafer can be accomplished by any means or combination of means known in the art, such as, for example, by spin, spray or jet coating, or by printing. After deposition the wafer back side coating is then exposed to a precise dosage of UV irradiation to partially cure the back side coating to a sufficient extent to provide adhesion to the back side of the semiconductor wafer and to retain a level of tackiness to attach the dicing tape. The process conditions for the irradiation, including UV intensity, time, wavelength, and pulse frequency, can be tuned, without undue experimentation by one skilled in the art, to control this level of adhesion as well as the tackiness of the coating. A method for assessing tackiness is described in the EXAMPLES section of this specification.

After the B-stage irradiation, a bare dicing tape (without any adhesive layer) is adhered to the wafer back side coating. In some instances, heat and pressure may be required to effect sufficient adhesion. The amount of heat and pressure can be determined without undue experimentation by one skilled in the art, or may be specified by the manufacturer. A preferred dicing tape is composed of stretchable polyolefin or polyester that is transparent to UV radiation. The wafer back side coating provides adequate adhesion of the wafer to the dicing tape during the dicing operation, that is, without any of the diced chips losing contact with the dicing tape.

After dicing, the wafer back side coating is exposed again to UV radiation, through the UV transparent dicing tape, to reduce the tackiness of the wafer back side coating. This reduction in tackiness enables easy removal of the dies including the wafer back side coating adhesive from the dicing tape, and subsequent transfer to the chosen substrate, using standard pick and place robotic equipment. Because there is no adhesive layer provided with the dicing tape, the wafer back side coating has a higher adhesion to the wafer than to the bare dicing tape.

In a further embodiment this invention is a method for preparing an assembly of semiconductor wafer, back side coating, and bare dicing tape comprising (a) providing a semiconductor wafer, (b) disposing a wafer back side coating on the semiconductor wafer, (c) partially curing the wafer back side coating to the extent that it adheres to the back side of the wafer and remains tacky, and (d) contacting the bare dicing tape to the partially cured and tacky wafer back side coating, optionally with heat and pressure.

These embodiments allow the use of a bare dicing tape without any adhesive, thus reducing the cost of the dicing tape and preventing contamination of the wafer back side coating with another adhesive.

EXAMPLES

Release of Wafer Back Side Coating (WBC) from Dicing tapes.

In the following examples, the level of tackiness of the B-staged adhesive is characterized by a quick, subjective, yet reproducible finger tack test, which correlates well with force measurements on a texture analyzer (made by TA Instruments). It is described here.

A layer of wafer back side coating material, approximately 50 μm thick is disposed on a ceramic tablet by a dam & fill method (using a 50 μm thick tape) and then B-staged under a xenon lamp for a total dosage of ~1000 mJ/cm$^2$. A finger (with a tightly-fitted nitrile glove) is pressed onto the B-staged adhesive surface with an approximate force of 100-150 g for a second and then withdrawn. The level of tackiness is rated according to the following rating system:
- 0: No sticking or resistance is felt when finger is removed.
- 1: No sticking or resistance is felt when finger is removed but barely visible specks are seen on the surface.
- 2: No sticking or resistance is felt when finger is removed but a clearly visible imprint is left on the surface
- 3: Slight sticking or resistance is felt when finger is removed and a visible imprint is left on the surface
- 4: Glass slide sticks to glove for a couple of seconds when finger is removed and a visible imprint is left on the surface.
- 5: Glass slide sticks to glove until it is pulled free. Resistance is felt when finger is removed and a visible imprint is left on the surface.

Example 1

Release Performance

Two polymeric films were used as dicing tapes for the samples to be tested, one being a polyolefin film (PO) and the other being a polyester (PE) film. The polyolefin film was a stretchable film supplied by Gunze Company of Japan, commonly used as the carrier tape for standard dicing tapes, and was provided with a standard corona treatment on one side. The polyester film was supplied by Toray Company of Korea, is commonly used as a protective liner for the adhesive used with dicing tapes, and was provided with a silicone coating on one side.

The wafer back side coating adhesive for the samples was Henkel Electronics Materials adhesive WBC8901 UV and was coated 20 μm thick onto eight 200 mm bare silicon wafers thinned to 75 um thickness. The coatings on four of the wafers were irradiated under a pulse xenon lamp (from Xenon Corp) for a duration of 45 seconds, the coatings on the remaining four wafers were irradiated under the same pulse xenon lamp for a duration of 60 seconds. The 45 second exposure corresponds to a dosage of about 675 mJ/cm$^2$ and the 60 second exposure corresponds to a dosage of about 850 mJ/Cm$^2$ (as measured by UV power puck Flash from EIT Inc, Va., USA). The 45 second exposures were fairly tacky (between rating 2 & 3 on the finger tack test); the 60 second exposures resulted in non-tacky coating surfaces (between rating 0 & 1 on the finger tack test).

Two of the four wafers that were coated with the wafer back side coating that was irradiated for 45 seconds were laminated to opposite sides of segments of the polyolefin tape; that is, one wafer was laminated to the corona-treated side of a segment of tape, and one wafer was laminated to the untreated side of a segment of tape. Two of the four wafers that were coated with the wafer back side coating that was irradiated for 60 seconds were likewise laminated to opposite sides of segments of the polyolefin tape; that is, one wafer was laminated to the corona-treated side of a segment of tape, and one wafer was laminated to the untreated side of a segment of tape.

Similar samples were made for the polyester tape using the four remaining wafers. That is, one wafer of the two wafers for which the wafer back side coating was irradiated for 45 seconds was laminated to the silicone coated side, and the second wafer was laminated to the uncoated side. Likewise, one wafer of the two wafers for which the wafer back side coating was irradiated for 60 seconds was laminated to the silicone coated side, and the second wafer was laminated to the uncoated side.

Lamination was accomplished using a Western Magnum XRL-120 roller laminator, operating at room temperature, with 70.3 g/cm$^2$ (20 psi) pressure at a rate of 60.96 cm/min (2 ft/minute).

After lamination, the wafers were diced in a Disco semi-automated DFD670 dicing machine to the die size of 10 mm×16 mm. Two-step dicing was done with blades HCDD & HCBB. After dicing the diced laminated wafers were subjected to further UV irradiation (with the dicing tape side exposed to the lamp) of 500 mJ/cm$^2$ under a UVEXS UV lamp (365 nm) to reduce the tackiness of the wafer back side coating and allow release from the dicing tapes. A Datacon APM 5000+ data bonder with a 19-needle ejector was used to push on the dies from bottom while a flat collet with uniformly distributed vacuum holes was used to pick-up the dies. The tapes were then examined for residue of wafer back side coating. Release results are reported in Table 1.

TABLE 1

| IRRADIATION CONDITIONS | SUBSTRATE | RESULT |
|---|---|---|
| 45 sec (675 mJ/cm$^2$) tacky | polyester without silicone coating | wafer back side coating transferred to polyester |
| 45 sec (675 mJ/cm$^2$) tacky | polyester with silicone coating | wafer back side coating did not transfer to polyester |
| 60 sec (850 mJ/cm$^2$) non-tacky | polyester without silicone coating | wafer back side coating transferred to polyester |
| 60 sec (850 mJ/cm$^2$) non-tacky | polyester with silicone coating | wafer back side coating did not transfer to polyester |
| 45 sec (675 mJ/cm$^2$) tacky | polyolefin with corona treatment | wafer back side coating transferred to polyolefin |
| 45 sec (675 mJ/cm$^2$) tacky | polyolefin without corona treatment | wafer back side coating did not transfer to polyolefin |
| 60 sec (850 mJ/cm$^2$) non-tacky | polyolefin with corona treatment | wafer back side coating transferred to polyolefin |
| 60 sec (850 mJ/cm$^2$) non-tacky | polyolefin without corona treatment | wafer back side coating did not transfer to polyolefin |

The data in Table 1 indicate that the non-corona treated lot of the polyolefin carrier tape and the silicone-coated lot of the PET carrier tape gave the desired release of wafer back side coating from the carrier tape and continued adherence of wafer back side coating to the diced semiconductor dies. The results show that the surface of the films was a key factor in acceptable pick-up performance. The use of the non-corona treated polyolefin film and of the silicone-treated surface for the polyester release liner allowed the dies from the diced wafer to be picked off the carrier tapes with the wafer back side coating adhered to the dies (and not left on the carrier tape itself) even when the partially cured wafer back side coating remained tacky. Moreover, this can be done without the need for a separate adhesive layer on the carrier tape.

Example 2

Pick-Up Performance

A die, singulated from a diced wafer, is removed from the carrier tape by a needle pushing up against the die through the carrier tape, after which it is robotically picked-up and moved to the desired substrate. The time required to push up the die from the carrier tape and the height that the needle needs to push before the die releases are measures of pick-up performance. The time is measured in milliseconds; shorter time means better process throughput. The height is measured in millimeters; less height means reduced probability of the needle cracking the die during pick-up. Thus, shorter time and less needle height indicate better pick-up performance.

The wafers laminated to the non-corona treated polyolefin carrier film (supplied by Gunze Company of Japan without adhesive) were evaluated for pick-up performance compared to a commercial dicing tape provided with a coated adhesive. The commercial dicing tape was Denka product UPP8010W1 consisting of a 10 μm layer of a proprietary UV curable adhesive on a 90 μm polyolefin carrier tape.

The wafer back side coating materials used were two from Henkel Electronics Materials: a commercial epoxy/acrylate material (WBC8901 UV) that forms a non-tacky coating (tackiness rating 0) and has a room temperature storage modulus of ~500 MPa after 90 seconds of UV irradiation; and a proprietary rubberized epoxy/acrylate material that forms a tacky coating (tackiness rating 4) and has a room temperature modulus of 2-3 MPa after 90-120 s of UV irradiation.

The wafers were prepared and diced as in Example 1 and then tested for pick-up performance using a standard pick and place robotic apparatus. The results are reported in Table 2 for the commercial epoxy/acrylate material (WBC8901 UV) that forms a non-tacky coating and that has a room temperature storage modulus of ~500 MPa, and in Table 3 for the rubberized epoxy/acrylate material that forms a tacky coating and that has a room temperature modulus of 2-3 MPa.

TABLE 2

PICK-UP SUCCESS/ATTEMPTS using WBC non-tacky coating

| Time (msec) | Non-corona treated, non-adhesive coated polyolefin film Needle Height (mm) | | Adhesive coated polyolefin film Needle Height (mm) | |
|---|---|---|---|---|
| | 0.1 | 0.2 | 0.1 | 0.2 |
| 5 | 5/5 | 5/5 | 0/5 | 0/5 |
| 10 | 5/5 | 5/5 | 0/5 | 0/5 |
| 30 | 10/10 | 5/5 | 0/5 | 0/5 |
| 50 | 10/10 | 10/10 | 0/5 | 0/5 |
| 100 | 10/10 | 10/10 | 10/10 | 10/10 |

TABLE 3

PICK-UP SUCCESS/ATTEMPTS
Using WBC tacky coating

| Time (msec) | Non-corona treated, non-adhesive coated polyolefin film Needle Height (mm) | | | Adhesive coated polyolefin film Needle Height (mm) | | |
|---|---|---|---|---|---|---|
| | 0.1 | 0.2 | 0.3 | 0.1 | 0.2 | 0.3 |
| 100 | 0/5 | 10/10 | 10/10 | 0/5 | 0/5 | 0/5 |
| 200 | 0/5 | 10/10 | 10/10 | 0/5 | 0/5 | 0/5 |
| 300 | 0/5 | 10/10 | 10/10 | 0/5 | 0/5 | 0/5 |

The results show that consistent pick-up at shorter times and lower needle heights was achieved with both WBC materials, non-tacky and tacky, on the non-adhesive coated polyolefin carrier. This is in contrast to the results using the adhesive coated polyolefin carrier where use of the tacky wafer back side coating prevented dies from being picked off the carrier tape, and use of the non-tacky wafer back side coating prevented dies from being picked off the carrier tape at low needle heights and short times.

The invention claimed is:

1. A method for preparing an assembly of semiconductor wafer, wafer back side coating, and bare dicing tape, the method comprising
   (a) providing a semiconductor wafer,
   (b) disposing a wafer back side coating in direct contact with the semiconductor wafer,
   (c) partially curing the wafer back side coating to the extent that it adheres to the back side of the wafer and remains tacky, and
   (d) contacting the bare dicing tape to the partially cured and tacky wafer back side coating to form a laminated wafer, optionally with heat and pressure,
   wherein the bare dicing tape does not contain an adhesive layer.

2. The method of claim 1, wherein the bare dicing tape is UV radiation transparent.

3. The method of claim 2 further comprising (e) exposing to laminated wafer to UV radiation to further cure the wafer back side coating.

4. A method for preparing an assembly of semiconductor wafer, wafer back side coating, and bare dicing tape, the method consisting of
   (a) providing a semiconductor wafer,
   (b) disposing a wafer back side coating in direct contact with the semiconductor wafer,
   (c) partially curing the wafer back side coating to the extent that it adheres to the back side of the wafer and remains tacky, and
   (d) contacting the bare dicing tape to the partially cured and tacky wafer back side coating to form a laminated wafer, optionally with heat and pressure,
   wherein the bare dicing tape does not contain an adhesive layer.

5. A method of removal of dies from a back side coated semiconductor wafer laminated with a bare dicing tape, the method comprising:
   (a) providing a back side coated semiconductor wafer formed by
      (i) applying a wafer back side coating in direct contact with the semiconductor wafer,
      (ii) partially curing the wafer back side coating to the extent that it adheres to the back side of the wafer and remains tacky, and (b) laminating the bare dicing tape directly to the partially cured wafer back side coating to form a laminated wafer, wherein the bare dicing tape is transparent to UV radiation;
(d) dicing to form a diced laminated wafer;
(e) exposing the diced laminated wafer to UV radiation to further cure the wafer back side and reduce tackiness; and
(f) removing the dies from the diced laminated wafer, wherein the bare dicing tape does not contain an adhesive layer.

* * * * *